United States Patent
Schein

(12) 
(10) Patent No.: US 6,650,134 B1
(45) Date of Patent: Nov. 18, 2003

(54) ADAPTER ASSEMBLY FOR CONNECTING TEST EQUIPMENT TO A WIRELESS TEST FIXTURE

(75) Inventor: Charles A. Schein, c/o Schein Research, Inc. d/b/a WirePro O.C. 4306 Regency Dr., Glenview, IL (US) 60025

(73) Assignee: Charles A. Schein, Glenview, IL (US)

( * ) Notice: Subject to any disclaimer, the term of this patent is extended or adjusted under 35 U.S.C. 154(b) by 0 days.

(21) Appl. No.: 10/124,846

(22) Filed: Apr. 18, 2002

Related U.S. Application Data

(63) Continuation-in-part of application No. 09/515,350, filed on Feb. 29, 2000, now abandoned.

(51) Int. Cl.[7] .......................... G01R 31/02; G01R 31/26
(52) U.S. Cl. .......................... 324/761; 324/754; 324/765
(58) Field of Search .................. 324/754, 758, 324/760, 761, 765, 158.1; 29/825, 830, 833; 439/482

(56) References Cited

U.S. PATENT DOCUMENTS

| | | | | |
|---|---|---|---|---|
| 5,157,325 A | * | 10/1992 | Murphy | 324/761 |
| 5,646,522 A | * | 7/1997 | Etemadpour et al. | 324/158.1 |
| 5,844,418 A | | 12/1998 | Wood et al. | |
| 6,043,669 A | * | 3/2000 | Carroll | 324/761 |
| 6,047,469 A | * | 4/2000 | Luna | 324/754 |
| 6,066,957 A | * | 5/2000 | Van Loan et al. | 324/758 |
| 6,208,158 B1 | * | 3/2001 | Schein et al. | 324/761 |
| 6,225,817 B1 | * | 5/2001 | Sayre et al. | 324/754 |
| 6,229,322 B1 | | 5/2001 | Hembree | |
| 6,326,799 B1 | * | 12/2001 | Schein | 324/754 |

FOREIGN PATENT DOCUMENTS

| | | | | |
|---|---|---|---|---|
| WO | WO9006518 | * | 6/1990 | G01R/1/02 |

* cited by examiner

*Primary Examiner*—Kamand Cuneo
*Assistant Examiner*—Jermele Hollington
(74) *Attorney, Agent, or Firm*—Jonathan D. Feuchtwang

(57) ABSTRACT

A method for connecting a testing device, used for in-circuit testing of a unit under test, to a test fixture used to support the unit under test, without the use of discrete wiring. First electrical contacts on the testing device are arranged in a first layout and second electrical contacts on the test fixture are arranged in a second layout different from the first layout. A translator board is provided having third electrical contacts arranged in the first layout on a first surface, and fourth electrical contacts arranged in the second layout on a second surface with conductive traces forming an electrical connection therebetween. The translator board is placed on the testing device such that the third electrical contacts directly contact and are electrically with the first electrical contacts. The fourth electrical contacts of the translator board are aligned with corresponding ones of the second electrical contacts on the test fixture and an electrical connection therebetween is provided using contact probes.

5 Claims, 6 Drawing Sheets

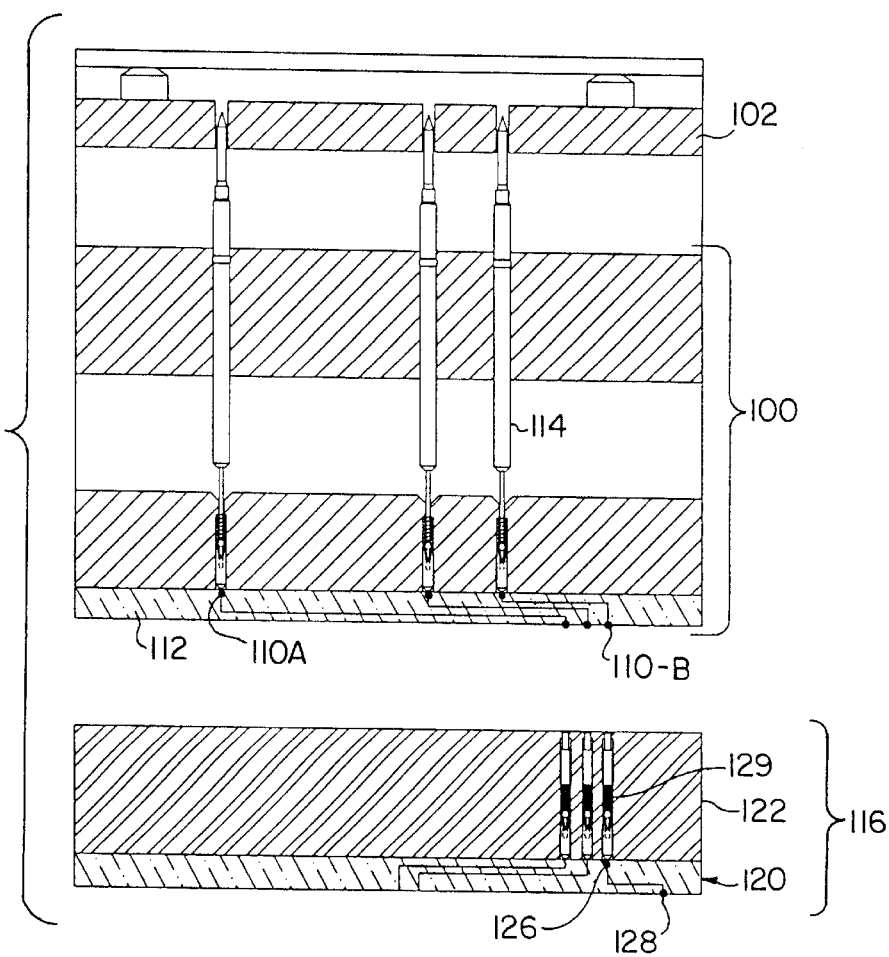

ADAPTER ASSEMBLY FOR CONNECTING TEST EQUIPMENT TO A WIRELESS TEST FIXTURE

This application is a continuation in part of U.S. Ser. No 09/515,350 filed Feb. 29, 2000, now abandon.

FIELD OF THE INVENTION

The present invention relates to an adapter assembly used during in-circuit testing of printed circuit boards. More particularly, the adapter assembly of the present invention provides an electrical connection between contacts on a test fixture to corresponding contacts on a receiver of an in-circuit testing device. The adapter assembly of the present invention makes the layout and spacing of electrical contacts on the test fixture independent of the layout of electrical contacts on the receiver.

BACKGROUND OF THE INVENTION

So-called wireless test fixtures are used to provide in-circuit testing of a unit under test. Such test fixtures are wireless in the sense that they use a printed wiring board to electrically connect a unit under test to an in-circuit testing device. The wireless test fixture does not utilize and discrete wiring (wire wrapping). Instead, wireless test fixtures use a printed wiring board and electrically conductive probes. The unit under test is electrically connected to the printed wiring board of the test fixture by conductive probes, and in turn the printed wiring board of the test fixture is connected to the receiver of the in-circuit testing device by another set of conductive probes.

One problem associated with the use of conventional test equipment relates to the size of the receiver. Presently, there is a requirement that the spacing and arrangement of electrical contacts on the wireless test fixture match the spacing and arrangement of electrical contacts on the receiver. Consequently, the size of the receiver which is determined by the number and spacing between of the contacts undesirably dictates the size of the wireless test fixture. To be more precise, the size of the receiver dictates the size of a printed wiring board contained in the wireless test fixture.

The manufacture of large scale (oversize) printed wiring boards is extremely expensive, and it would be highly cost effective to reduce the size of the printed wiring board contained in the wireless test fixture whenever possible.

Accordingly, an object of the present invention is to provide an adapter assembly which makes the layout and spacing of electrical contacts of the printed wiring board of the wireless test fixture independent of the layout and spacing of electrical contacts of the receiver of the in-circuit testing device.

SUMMARY OF THE INVENTION

Briefly, the present invention relates to an adapter assembly electrically connecting a printed wiring board of a wireless test fixture with an interface of an in-circuit testing device.

According to a first embodiment, a method is disclosed for making the layout and spacing of electrical contacts on a test fixture independent of a layout and spacing of corresponding electrical contacts on a receiver of an in-circuit testing device. The test fixture is used to electrically connect a unit under test to the receiver of the in-circuit testing device to inspect the unit under test.

The receiver has a mating surface having a first surface area with plural first electrical contacts arranged in a first layout, and the test fixture has a testing surface having a second surface area smaller than the first surface area with plural second electrical contacts arranged in a second layout. The spacing between adjacent second electrical contacts is smaller than the spacing between adjacent first electrical contacts.

The method includes the steps of providing a translator board having a plurality of third electrical contacts arranged on a third surface in the first layout and a plurality of fourth electrical contacts arranged on a fourth surface in the second layout. Individual third electrical contacts are electrically connected to corresponding fourth electrical contacts by conductive traces contained within the translator board.

The translator board is placed in contact with the in-circuit testing device such that the third electrical contacts of the translator board are brought into electrical contact with corresponding ones of the first electrical contacts on the mating surface of the receiver.

Next, the test fixture is placed in contact with the translator board such that the electrical contacts on the fourth surface of the translator board are brought into electrical contact with corresponding ones of the second electrical contacts on the testing surface of the test fixture.

Importantly, the translator board makes the layout and spacing of electrical contacts on the test fixture independent of the layout and spacing of corresponding electrical contacts on the receiver, and enables the use of a test fixture whose testing surface has a smaller surface area than that of the receiver of the in-circuit testing device.

BRIEF DESCRIPTION OF THE DRAWINGS

FIGS. 5A and 5B are side views showing the alternate embodiments of the adapter assembly of the present invention in relation to a conventional wireless test fixture.

DETAILED DESCRIPTION OF THE INVENTION

Figure 1A:
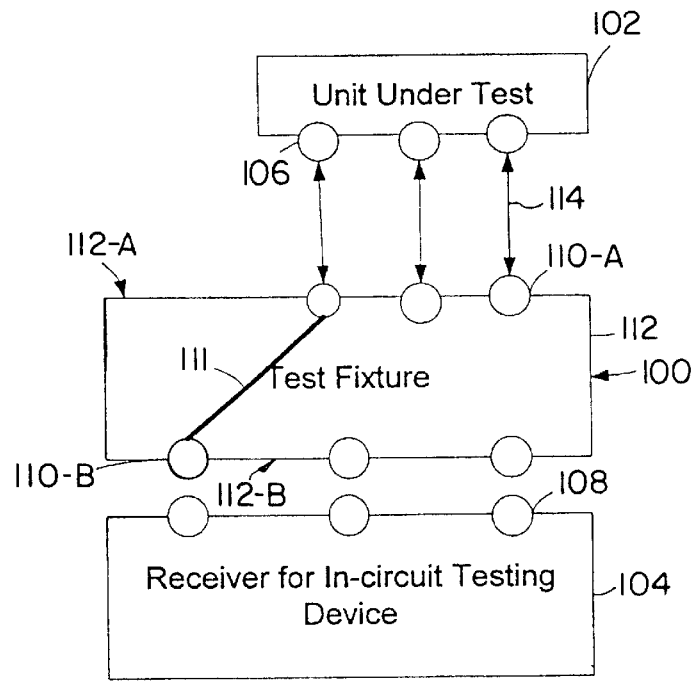
FIGS. 1A and 1B show a conventional assembly used for in-circuit testing of circuit boards.
Figure 1B:
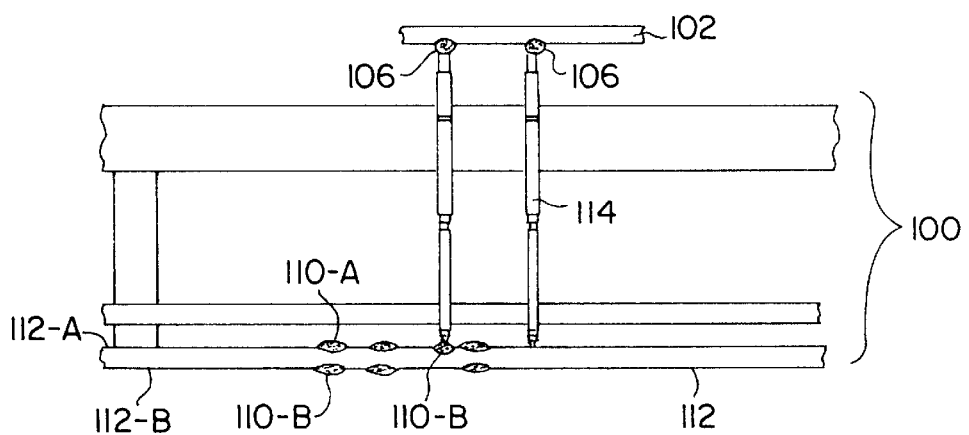
Figure 2:
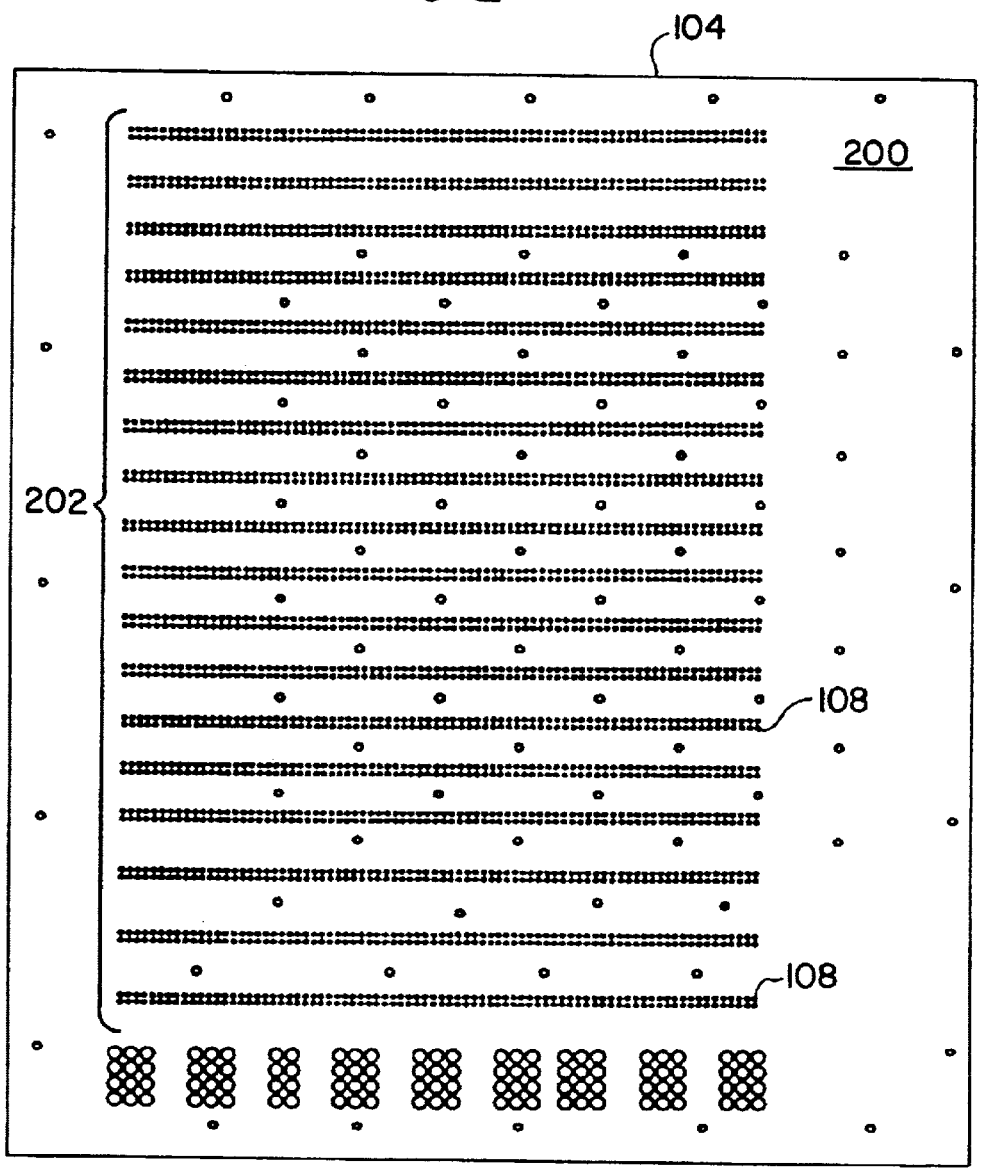
FIG. 2 is an enlarged view of an electrical interface of an in-circuit testing device.

FIGS. 1A and 1B depict a conventional wireless test fixture 100 used to connect a unit under test 102 to a receiver 104 (FIG. 2) of a wireless testing device. U.S. Pat. No. 6,326,799 which is incorporated herein by reference thereto discloses a wireless testing fixture 100 such as is known in the art.

The wireless test fixture 100 includes a printed wiring board 112 having electrical contacts 110-A on a top surface 112-A and electrical contacts 110-B on a bottom surface 112-B Test points (electrical contacts) 106 on the unit under test 102 are connected to corresponding electrical contacts 110-A on the printed wiring board 112 by electrically conductive probes 114. Conductive traces 111 formed within the printed wiring board 112 connect corresponding electrical contacts 110-A and 110-B.

In operation, the unit under test 102 is place on top of a wireless test fixture 100 which in turn is placed on top of the receiver 104. See FIG. 1A The electrical connection between the test fixture 100 and the receiver 104 of the in-circuit testing device is accomplished without the use of discrete wiring. As used throughout this disclosure, the term "wireless" refers to the use of a printed wiring board in place of discrete wires.

THE PROBLEM

In conventional wireless test assemblies the spacing between adjacent contacts 108 on the receiver 104 is exceptionally large in the application of wireless test fixtures. In order to connect each of the conductors 108 on the receiver 104 to corresponding contacts 110-B on the printed wiring board 112 without the use of discrete wiring (wire wrapping or other dedicated wiring), i.e. through direct physical contact between corresponding electrical contacts, the arrangement and spacing of contacts 110-B on the printed wiring board 112 must match the arrangement and spacing of contacts 108 within the receiver 104. As a consequence, the layout of contacts 108 on the receiver 104 dictates the minimum physical size of the printed wiring board 112.

As one of ordinary skill in the art will appreciate, the interface 104 is relatively large, and typically includes thirty or more rows of contacts 108. The cost of manufacturing a printed wiring board 112 is directly related to its size. It is financially inefficient to utilize a large scale (oversize) printed wiring board 112 in applications where a small scale printed wiring board will suffice.

THE SOLUTION

FIGS. 3–5B show the adapter assembly 116 of the present invention. According to a first aspect, the adapter assembly 116 makes the spacing of contacts 110-B and thus the physical dimensions of the printed wiring board 112 substantially independent of the layout of contacts 108 within the receiver 104.

Figure 3:
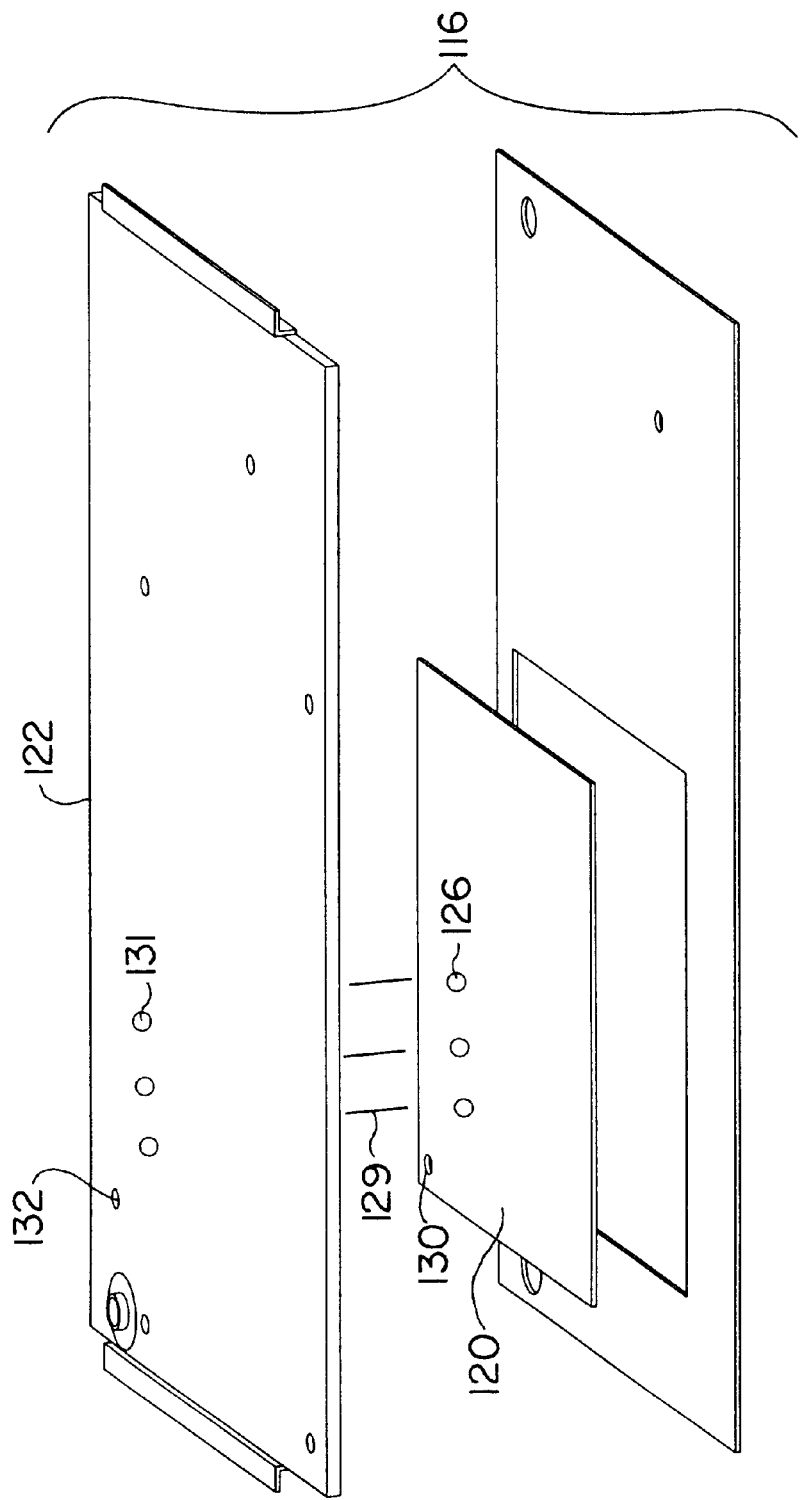
FIG. 3 is an exploded view of an adapter assembly according to the present invention.

As best seen in FIG. 3, the adapter assembly 116 includes a translator board 120 and a top plate 122.

Figure 4A:
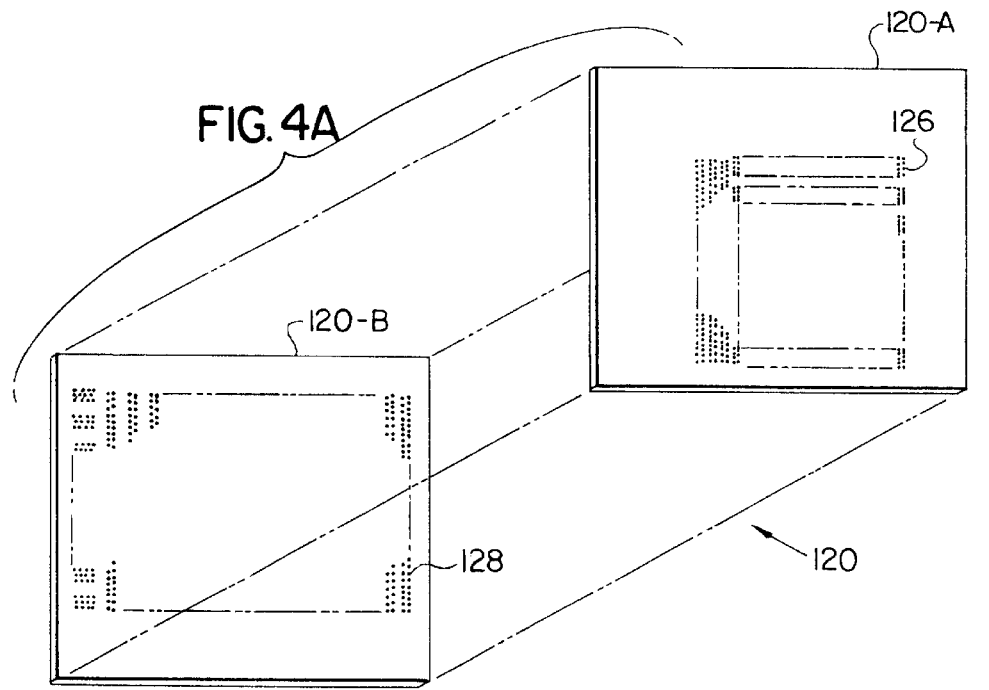
FIG. 4A shows the top and bottom surfaces of a translator board of the adapter assembly according to the present invention.
Figure 4B:
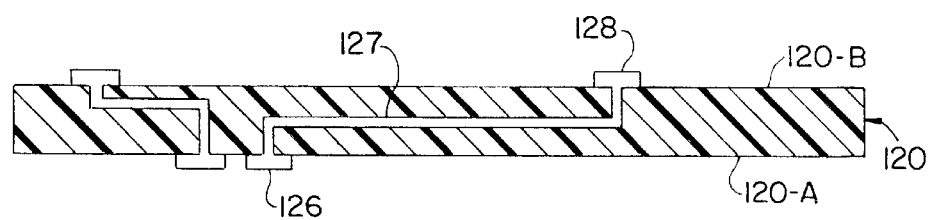
FIG. 4B is a partial cross-sectional view of the translator board of FIG. 4A.

Referring now to FIGS. 4A and 4B, the translator board 120 is a printed wiring board such as is commonly known in the art, having a top surface 120-A and a bottom surface 120-B. A plurality of electrical contacts 126 arranged on the top surface 120-A are connected to corresponding electrical contacts 128 on the bottom surface 120-B in a one-to-one relationship by conductive traces 127 (FIG. 4B). The precise method for forming the traces 127 within the translator board 120 is well known in the art, and does not form part of the present invention.

The electrical contacts 128 on surface 120-B are spaced and arranged to correspond to the spacing and layout of contacts 108 within the receiver 104. The electrical contacts 126 on surface 120-A of the translator board 120 are spaced and arranged differently than the contacts 128. In particular, the spacing between adjacent contacts on surface 120-A is more compressed than the spacing between adjacent contacts on surface 120-B.

According to a preferred embodiment, the spacing and arrangement of contacts 126 is determined to maximize the density of contacts per unit area. Notably, the spacing and arrangement of contacts, 110-B (FIG. 5A) of the printed wiring board 112 must match the spacing and arrangement of contacts 126, and thus the arrangement of contacts 126 determines the minimum size of the printed wiring board 112. Importantly, the arrangement and spacing between contacts 110-B on the printed wiring board 112 (minimum the size of the wiring board 112) is no longer dictated by the arrangement and spacing of contacts 108 within the receiver 104.

Further still, according to the presently preferred embodiment, the electrical contacts 126 are arranged such that the corresponding contacts 110-B are generally centered on the printed wiring board 112.

Referring once again to FIG. 3, the top plate 122 is formed of an electrically insulating material and is provided with plural through holes 131 arranged in a layout corresponding to the layout of contacts 110-B and 126 in a one-to-one relationship. The primary purpose of the top plate 122 is to support and align probe contacts 129 electrically connecting the contacts 126 on the translator board 120 to the electrical contacts 110-B on the printed wiring board 112.

According to a presently preferred embodiment, the top plate 122 is mounted to the translator board 120 using screws or the like (not illustrated).

FIG. 5A is a cross-sectional view showing how the adapter assembly 116 of the present invention is used in conjunction with a conventional wireless test fixture 100.

In operation, the adapter assembly 116 is placed in a pre-defined relationship with the receiver 104 by a combination of alignment pins and spacers (not illustrated) which align the contacts 128 with the corresponding contacts 108. In FIG. 5A, the electrical connection between the contacts 128 and the contacts 108 is accomplished by direct physical contact therebetween.

Figure 5B:
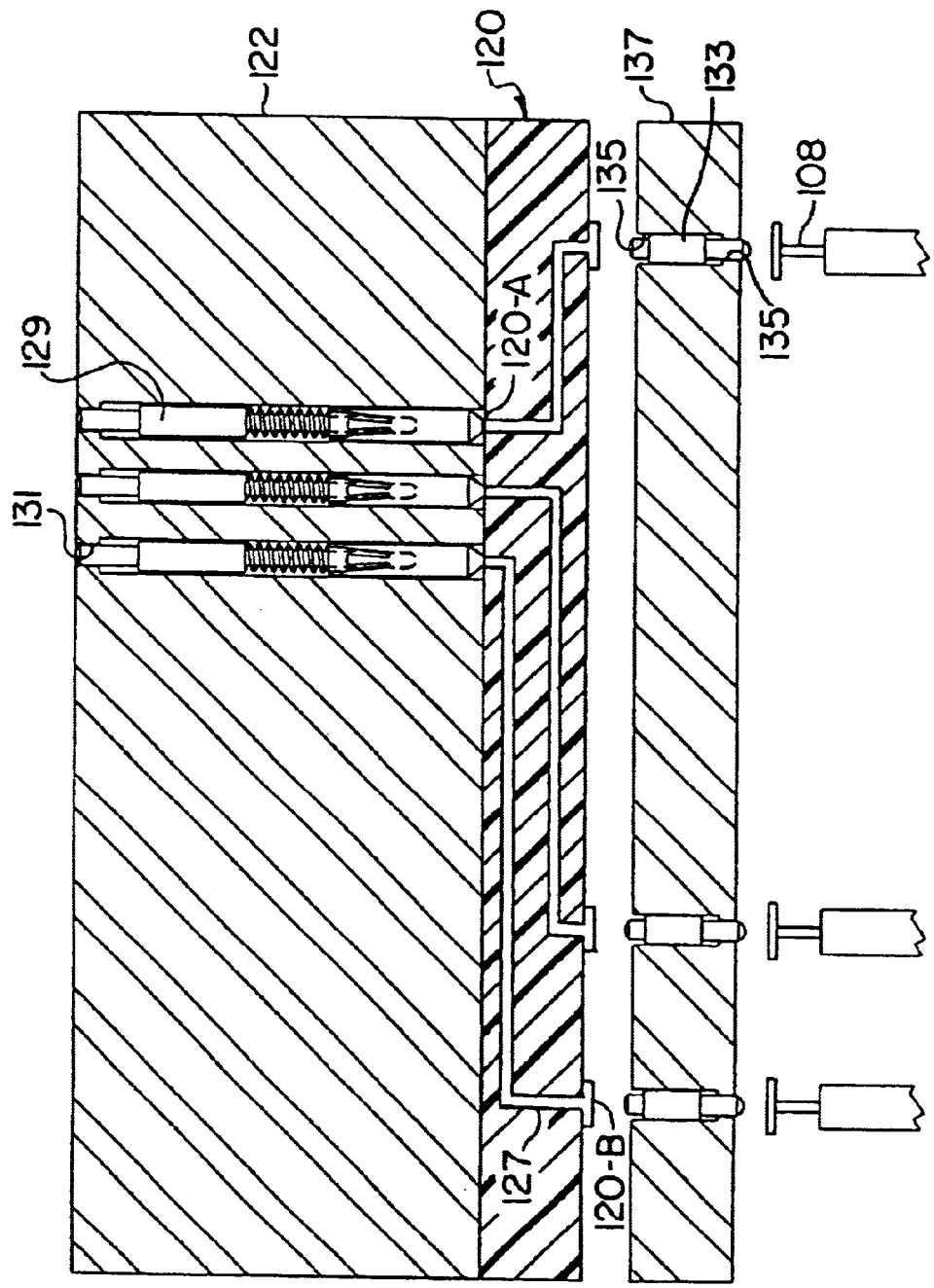

FIG. 5B shows an alternate embodiment in which conductive probes (transfer pins) 133 are used to provide the electrical connection between the contacts 128 and the contacts 108. The conductive probes 133 are supported within through holes 135 formed in support board 137. The support board 137 is similar to the top plate 122 in that its primary purpose is to support the conductive probes 133. Like the top plate 122, the support board 137 is formed of an electrically insulating material.

Next, the test fixture 100 is placed in a pre-defined relationship with the adapter assembly 116 by a combination of alignment pins and spacers (not illustrated) which align the contacts 110-B with the corresponding contacts 126. Contact probes 129 in through holes 131 electrically connect the contacts 128 with the contacts 108.

Finally, the unit under test 102 is placed in a pre-defined relationship with the test fixture 100 such that contacts 106 are aligned with corresponding contacts 110-A, with contact probes 114 providing electrical connection therebetween.

A partial vacuum is typically used to pull the unit under test 102 into firm electrical contact with the wireless test fixture 100. Moreover, a partial vacuum may also be used to pull the wireless assembly 100 into firm electrical contact with the receiver 104.

In the embodiment depicted in FIG. 3, the translator board 120 is provided with vacuum ports 130, 132 which are configured to communicate with corresponding ports (not illustrated) formed within the interface 104. The vacuum port 130 communicates with a corresponding vacuum port 134 formed in the top plate 122.

In the embodiment depicted in FIG. 3, the translator board 120 is provided with vacuum port 130 which communicates with a corresponding vacuum port 132 formed in the top plate 122. The vacuum ports 130, 132 communicate an applied vacuum force from the receiver 104 to the unit under test 102 through similar ports (not illustrated) formed in the test fixture 100. The applied vacuum force urges the unit under test 102 towards the wireless test fixture 100, and urges the wireless test fixture 100 towards the top plate 122 of the adapter assembly 116.

Although a preferred embodiment of the adapter assembly of the present invention has been specifically described and illustrated, it is to be understood that variations or alternative embodiments apparent to those skilled in the art are within the scope of this invention. Since many such variations may be made, it is to be understood that within the scope of the following claims, this invention may be practiced otherwise than specifically described.

What is claimed is:

1. A method for making layout and spacing of electrical contacts on a printed wiring board of a test fixture independent of a layout and spacing of corresponding electrical contacts on a receiver of an in-circuit testing device, where the test fixture is used to electrically connect a unit under test to the receiver of the in-circuit testing device to inspect the unit under test, the receiver having a mating surface having plural first electrical contacts arranged in a first spacing arrangement, the printed wiring board of the test fixture having a testing surface whose area is less than that of the mating surface, plural second electrical contacts on the testing surface arranged in a second spacing arrangement with a spacing between adjacent second electrical contacts being smaller than a spacing between adjacent first electrical contacts, the method comprising the steps of:

providing a translator board having a plurality of third electrical contacts arranged on a bottom surface in the first spacing and arrangement and a plurality of fourth electrical contacts arranged on a top surface in the second spacing and arrangement, individual ones of said plurality of third electrical contacts being electrically connected to individual ones of said plurality of fourth electrical contacts by conductive traces contained within the translator board;

placing the translator board in contact with the in-circuit testing device such that the third electrical contacts on the bottom surface of the translator board are brought into electrical contact with corresponding ones of the first electrical contacts on the mating surface of the receiver; and placing the test fixture in contact with the translator board such that the fourth electrical contacts on the top surface of the translator board are brought into electrical contact with corresponding ones of the second electrical contacts on the testing surface of the test fixture;

wherein the translator board makes the area of the printed wiring board of the test fixture independent of the spacing and arrangement of said first electrical contacts on the receiver.

2. A method for connecting a testing device, used for in-circuit testing of a unit under test, to a wireless test fixture used to support the unit under test, without the use of discrete wiring between first electrical contacts on an interface of the testing device and second electrical contacts on a printed wiring board of the test fixture, where the first electrical contacts are arranged in a first spacing and arrangement and the second electrical contacts are arranged in a second spacing and arrangement different from the first spacing and arrangement, said method comprising the steps of:

providing an adapter assembly including a translator board having and lower surfaces, said lower surfaces having a plurality of third electrical contacts arranged in the first spacing and arrangement, said upper surface having a plurality of fourth electrical contacts arranged in the second spacing and arrangement, individual ones of said plurality of third electrical contacts being electrically connected to individual ones of said plurality of fourth electrical contacts by conductive traces contained within the translator board;

placing the adapter assembly in a pre-defined relationship with the testing device such that the third electrical contacts directly contact and are electrically with corresponding ones of the first electrical contact on the testing device; and placing the test fixture in a pre-defined relationship with the adapter assembly such that the fourth electrical contacts are aligned with corresponding ones of the second electrical contacts on the test fixture and providing an electrical connection therebetween using contact probes;

wherein the translator board makes the area of the printed wiring board of the test fixture independent of the spacing and arrangement of the first electrical contacts on the interface of the test equipment.

3. A method for connecting test points on a circuit board to a device performing in-circuit testing of the circuit board without the use of discrete wiring to connect electrical contacts on the circuit board to corresponding electrical contacts on the in-circuit testing device, the electrical contacts on a receiver of the in-circuit testing device being arranged in a first spacing and arrangement, said method comprising the steps of:

providing a test fixture supporting plural first contact probes in a layout corresponding to an arrangement of the electrical contacts on the circuit board, said test fixture including a printed wiring board having an engagement surface having plural electrical contacts arranged in a second spacing and arrangement different from the first spacing and arrangement;

providing an adapter assembly including a translator board having upper and lower surfaces, said lower surface having a plurality of first electrical contacts arranged in the first spacing and arrangement, said lower surface having a plurality of second electrical contacts arranged in the second spacing and arrangement, individual ones of said plurality of second electrical contacts by conductive traces contained within the translator board;

placing the adapter assembly in a pre-defined relationship with the in-circuit testing device such that the first electrical contacts are aligned with the corresponding ones of the electrical contacts on the receiver of the in-circuit testing device, and providing an electrical connection therebetween using second contact probes;

placing the test fixture in direct physical contact with the adapter assembly such that the second electrical contacts are brought into direct electrical contact with corresponding ones of the electrical contacts on the test fixture; and placing the circuit board in direct physical contact with the test fixture such that selected ones of the first contact probes contact corresponding ones of the electrical contacts on the circuit board forming an electrical circuit between the electrical contacts on the circuit board and the electrical contacts on the receiver of the in-circuit testing device;

wherein a spacing between adjacent contacts on the printed wiring board of the test fixture is independent of a spacing between adjacent electrical contacts on the in-circuit testing device, and an area of the printed wiring board is independent of the spacing and arrangement of electrical contacts on the receiver of the in-circuit testing device.

4. A translator board providing electrical connection between first electrical contacts on a receiver of in-circuit testing device and second electrical contacts on a printed wiring board of a test fixture without the use of discrete wires within the test fixture, the first electrical contacts being arranged in a first layout with a first spacing between adjacent first electrical contacts, the second electrical contacts being arranged in a second layout with a second spacing between adjacent second electrical contacts, the second spacing being smaller than the first spacing, said translator board comprising:

printed wiring board having first and second surfaces;
 a plurality of third electrical contacts arranged in the first layout on the first surface; and
 a plurality of fourth electrical contacts arranged in the second layout on the second surface;
 said printed wiring board electrically connecting the first electrical contacts with the second contacts;
 wherein the translator board makes the area or the printed wiring board of the test fixture independent of the spacing and arrangement of first electrical contacts.

5. An adapter assembly providing electrical connection between a printed wiring board of a wireless test assembly and a receiver of an in-circuit testing device without the use of discrete wires to connect first electrical contacts on the receiver in a first layout having a first spacing between adjacent contacts and second electrical contacts on the printed wiring board arranged in a second layout having a second spacing between adjacent contacts smaller than the first spacing, said adapter assembly comprising:

a translator board having first and second opposing surfaces;
 third electrical contacts arranged on said first surface in the first layout;
 fourth electrical contacts arranged on said second surface in the second layout;
 said third electrical contacts being electrically connected in a one-to-one relationship to corresponding fourth electrical contacts by conductive traces within the translator board;
 an electrically insulating board having a plurality of through holes arranged in the first layout; and
 a plurality of conductive probes, one said probe being inserted into each said through hole and forming a separate circuit electrically connecting a selected said first electrical contact to a corresponding said second electrical contact via said third and fourth contacts;
 wherein the translator board makes the area of the printed wiring board of the wireless test assembly independent of the layout and spacing of the first electrical contacts.

* * * * *